United States Patent
Choi et al.

(10) Patent No.: US 10,804,350 B2
(45) Date of Patent: Oct. 13, 2020

(54) ORGANIC LIGHT-EMITTING DISPLAY DEVICE

(71) Applicant: Samsung Display Co., Ltd., Yongin-si (KR)

(72) Inventors: Sang Moo Choi, Yongin-si (KR); Seung Kyu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 193 days.

(21) Appl. No.: 15/955,626

(22) Filed: Apr. 17, 2018

(65) Prior Publication Data

US 2018/0308918 A1    Oct. 25, 2018

(30) Foreign Application Priority Data

Apr. 19, 2017    (KR) .................. 10-2017-0050588

(51) Int. Cl.
| | | |
|---|---|---|
| *G09G 3/3233* | (2016.01) | |
| *H01L 27/32* | (2006.01) | |
| *H01L 51/52* | (2006.01) | |
| *G09G 3/3266* | (2016.01) | |

(52) U.S. Cl.
CPC ....... *H01L 27/3276* (2013.01); *G09G 3/3233* (2013.01); *H01L 51/5206* (2013.01); *G09G 3/3266* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2310/0264* (2013.01); *G09G 2330/028* (2013.01)

(58) Field of Classification Search
CPC .................. G09G 3/3233; G09G 3/32; G09G 2310/0264; H01L 27/3276; H01L 51/5206
See application file for complete search history.

(56) References Cited

U.S. PATENT DOCUMENTS

| | | | |
|---|---|---|---|
| 8,947,329 B2 | 2/2015 | Choi | |
| 9,691,325 B2 | 6/2017 | Park et al. | |
| 2007/0070017 A1* | 3/2007 | Wei ...................... | G09G 3/3659 345/98 |
| 2007/0085781 A1* | 4/2007 | Chung ................. | G09G 3/3233 345/76 |
| 2011/0164018 A1* | 7/2011 | Kang ................... | G09G 3/3233 345/211 |
| 2012/0038612 A1* | 2/2012 | Chung ................. | G09G 3/3233 345/211 |

(Continued)

FOREIGN PATENT DOCUMENTS

| | | |
|---|---|---|
| KR | 10-1142644 | 5/2012 |
| KR | 10-2016-0043594 | 4/2016 |
| KR | 10-2016-0059575 | 5/2016 |

*Primary Examiner* — Antonio Xavier
(74) *Attorney, Agent, or Firm* — H.C. Parks & Associates PLC

(57) ABSTRACT

An organic light-emitting display device including: pixels disposed on each of horizontal lines, each of the pixels includes an organic light-emitting diode, and an auxiliary transistor coupled between an anode electrode of the organic light-emitting diode and an auxiliary power source; and at least one reference transistor disposed on each of the horizontal lines and coupled between a reference power source and at least one of the pixels. The auxiliary transistor and the reference transistor may be simultaneously turned on.

17 Claims, 9 Drawing Sheets

(56) References Cited

U.S. PATENT DOCUMENTS

| | | | | |
|---|---|---|---|---|
| 2014/0333686 A1* | 11/2014 | Kim | ............... | G09G 3/3233 |
| | | | | 345/694 |
| 2015/0348464 A1* | 12/2015 | In | ............... | G09G 3/2022 |
| | | | | 345/205 |
| 2016/0012780 A1* | 1/2016 | Lee | ............... | G09G 3/3291 |
| | | | | 315/172 |
| 2016/0140897 A1* | 5/2016 | Park | ............... | G09G 3/3225 |
| | | | | 345/77 |
| 2016/0379552 A1* | 12/2016 | Kim | ............... | G09G 3/3208 |
| | | | | 345/76 |
| 2017/0269783 A1* | 9/2017 | Yang | ............... | G06F 3/0412 |
| 2017/0270860 A1* | 9/2017 | Wang | ............... | G09G 3/3233 |
| 2018/0151099 A1* | 5/2018 | Choi | ............... | H01L 27/1225 |
| 2019/0362670 A1* | 11/2019 | Liu | ............... | G09G 3/32 |

* cited by examiner

ORGANIC LIGHT-EMITTING DISPLAY DEVICE

CROSS REFERENCE TO RELATED APPLICATION

This application claims priority from and the benefit of Korean Patent Application No. 10-2017-0050588, filed on Apr. 19, 2017, which is hereby incorporated by reference for all purposes as if fully set forth herein.

BACKGROUND

Field

Exemplary embodiments of the present invention relate to an organic light-emitting display device.

Discussion of the Background

With advances in information technology, the importance of a display device as a connection medium between a user and information has been emphasized. Because of the importance of the display device, the use of various display devices, such as a liquid crystal display (LCD) device and an organic light-emitting display device, has increased.

The organic light-emitting display device displays an image using organic light-emitting diodes which generate light by recombination of electrons and holes. The organic light-emitting display device is advantageous in that it has a high response speed and is able to display a clear image.

Such an organic light-emitting display device includes pixels, a data driver configured to supply data signals to the pixels, a scan driver configured to supply scan signals to the pixels, and an emission driver configured to supply emission control signals to the pixels.

The above information disclosed in this Background section is only for enhancement of understanding of the background of the inventive concepts. Therefore, it may contain information that does not form the prior art that was already known to a person of ordinary skill in the art or was publically available prior to an effective filing date of subject matter disclosed herein.

SUMMARY

Exemplary embodiments of the present invention provide an organic light-emitting display device which is able to mitigate luminance unevenness, thus providing to improved image quality.

Additional features of the invention will be set forth in the description which follows, and in part will be apparent from the description, or may be learned by practice of the invention.

An exemplary embodiment of the present invention discloses an organic light-emitting display device including: pixels disposed on each of horizontal lines, each of the pixels including an organic light-emitting diode, and an auxiliary transistor coupled between an anode electrode of the organic light-emitting diode and an auxiliary power source; and at least one reference transistor disposed on each of the horizontal lines and coupled between a reference power source and at least one of the pixels. The auxiliary transistor and the reference transistor may be simultaneously turned on.

In an exemplary embodiment, one reference transistor may be disposed on each of the horizontal lines, and the reference transistor may be electrically coupled to all pixels disposed on the corresponding horizontal line.

In an exemplary embodiment, a plurality of reference transistors may be disposed on each of the horizontal lines, and each of the plurality of reference transistors may be electrically coupled to different pixels disposed on the corresponding horizontal line.

In an exemplary embodiment, a plurality of reference transistors may be disposed on each of the horizontal lines, and the plurality of reference transistors may be electrically coupled in one-to-one correspondence with the respective pixels disposed on the corresponding horizontal line.

In an exemplary embodiment, the auxiliary power source may be set such that the organic light-emitting diode does not emit light.

An exemplary embodiment of the present invention also discloses an organic light-emitting display device including: pixels disposed on an i-th horizontal line, wherein i is a natural number, each of the pixels including an organic light-emitting diode, and an auxiliary transistor coupled between an anode electrode of the organic light-emitting diode and an auxiliary power source, the pixel being configured to control, in response to a data signal, a driving current flowing from a first pixel power source to a second pixel power source via the organic light-emitting diode; and a reference transistor disposed on the i-th horizontal line, and electrically coupled with a reference power source. The reference transistor may be turned on or off simultaneously with the auxiliary transistor. The pixels may be electrically coupled with the reference power source during a period in which a voltage of the data signal is stored, and may be electrically coupled with the first pixel power source during a period other than the period in which the voltage of the data signal is stored.

In an exemplary embodiment, each of the pixels disposed on the i-th horizontal line may further include: a first transistor coupled between a first node and a second node, and including a gate electrode coupled to a third node; a second transistor coupled between a data line and the first node, and including a gate electrode coupled to an i-th scan line; a third transistor between the third node and the second node, and including a gate electrode coupled to the i-th scan line; and at least one emission control transistor disposed on a path of the driving current, and including a gate electrode coupled to an i-th emission control line.

In an exemplary embodiment, the emission control transistor may include: a fourth transistor between the first pixel power source and the first node, and including a gate electrode coupled to the i-th emission control line; and a fifth transistor coupled between the reference transistor and the third node, and including a gate electrode coupled to the i-th emission control line.

In an exemplary embodiment, the emission control transistor may further include: a sixth transistor coupled between the second node and the anode electrode of the organic light-emitting diode, and including a gate electrode coupled to the i-th emission control line.

In an exemplary embodiment, each of the pixels disposed on the i-th horizontal line may further include: a seventh transistor coupled between the third node and the auxiliary power source, and including a gate electrode coupled to an i−1-th scan line.

In an exemplary embodiment, a gate electrode of the reference transistor and a gate electrode of the auxiliary transistor may be electrically coupled to an i-th auxiliary line.

In an exemplary embodiment, an auxiliary signal to be supplied to the i-th auxiliary line may overlap an emission control signal to be supplied to the i-th emission control line.

In an exemplary embodiment, a voltage of the reference power source may be less than or equal to a voltage of the first pixel power source.

An exemplary embodiment of the present invention also discloses an organic light-emitting display device including: a display unit comprising a plurality of pixels and a plurality of reference transistors; a scan driver configured to supply scan signals to a plurality of scan lines coupled to the pixels; an auxiliary driver configured to supply auxiliary signals to a plurality of auxiliary lines coupled to the pixels; a data driver configured to supply data signals to a plurality of data lines coupled to the pixels; and an emission driver configured to supply emission control signals to a plurality of emission control lines coupled to the pixels. At least one reference transistor coupled to an i-th auxiliary line among the reference transistors may be coupled between pixels coupled to the i-th auxiliary line among the pixels and a reference power source, wherein i is a natural number, and include a gate electrode coupled to the auxiliary line. One of the pixels that is coupled to an i-th scan line, the i-th auxiliary line, an i-th emission control line, and a j-th data line, wherein j is a natural number, may include: an organic light-emitting diode; a pixel circuit configured to control a driving current flowing from a first pixel power source to a second pixel power source via the organic light-emitting diode; and an auxiliary transistor coupled between an auxiliary power source and an anode electrode of the organic light-emitting diode, and including a gate electrode coupled to the i-th auxiliary line.

In an exemplary embodiment, the pixel may receive, from the i-th emission control line, an emission control signal having a gate-off voltage during a first sub-period. The pixel may receive, from the i-th emission control line, a gate-on voltage during a second sub-period. The second sub-period may be in succession to the first sub-period.

In an exemplary embodiment, the pixel may receive, from the i-th auxiliary line, an auxiliary signal having a gate-on voltage during an auxiliary period. The first sub-period may be set to overlap the entirety of the auxiliary period.

In an exemplary embodiment, the pixel circuit may store a voltage of a data signal supplied to the j-th data line based on the reference power source when a scan signal is supplied to the i-th scan line during the first sub-period. The pixel circuit may interrupt the flow of the driving current during the first sub-period, and allow the driving current to flow during the second sub-period.

In an exemplary embodiment, the scan driver and the auxiliary driver may be set to an identical driver.

In an exemplary embodiment, a voltage of the reference power source may be less than or equal to a voltage of the first pixel power source.

In an exemplary embodiment, the organic light-emitting display device may further include a voltage generator configured to supply the first pixel power, the second pixel power, the auxiliary power, and the reference power to the display unit. The auxiliary power source may be set such that the organic light-emitting diode does not emit light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
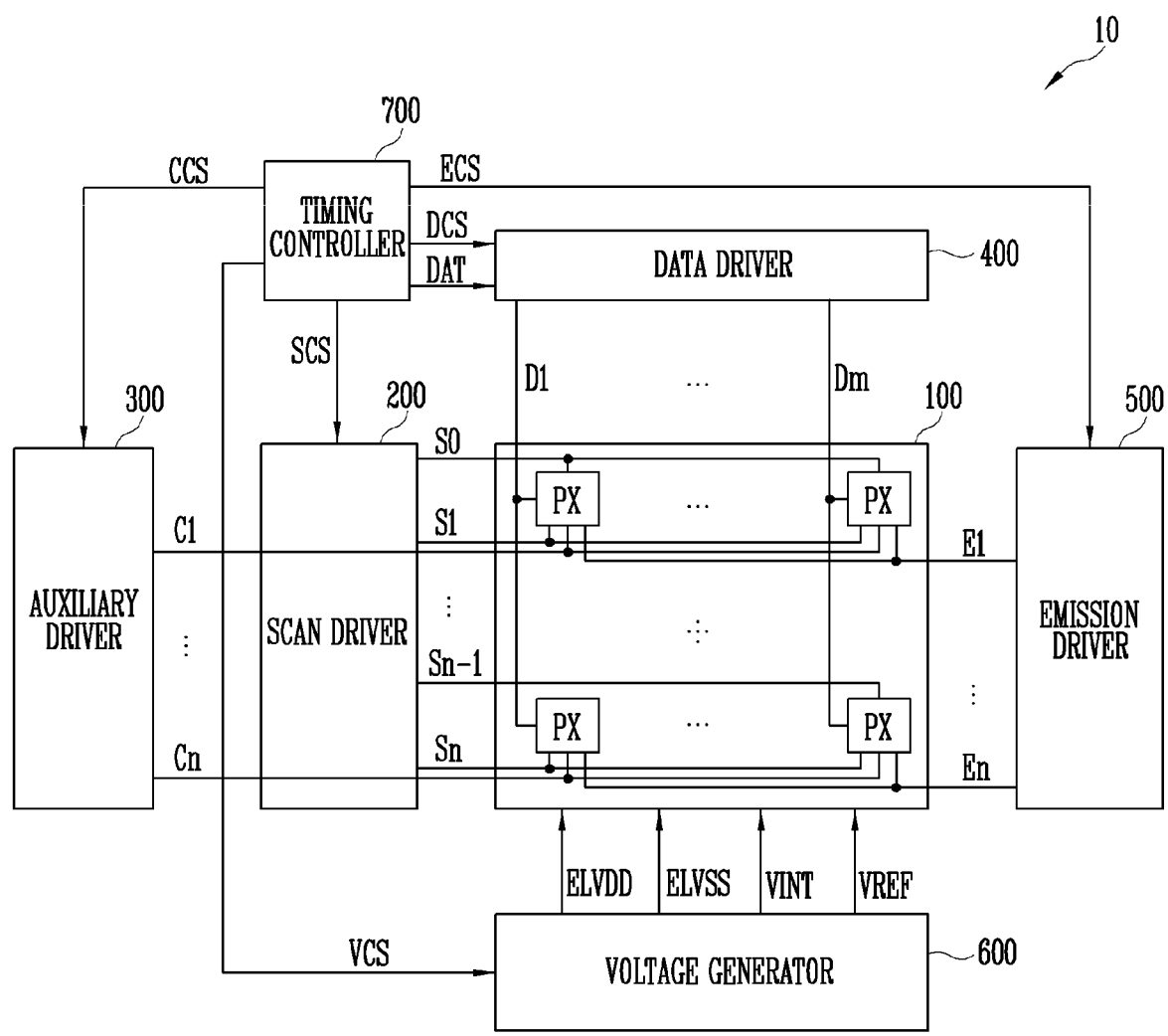
FIG. 1 is a diagram illustrating a display device in accordance with an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of elements, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein Details of various exemplary embodiments are included in the detailed descriptions and drawings.

Advantages and features of the present disclosure, and methods for achieving the same will be explained with reference to exemplary embodiments described later in detail together with the accompanying drawings. However, it is to be noted that the present disclosure is not limited to the disclosed exemplary embodiments but can be embodied in various other ways. In this specification, "connected/coupled" refers to one component not only directly coupling another component but also indirectly coupling another component through an intermediate component. Furthermore, in the drawings, portions unrelated to the present disclosure have been omitted to clarify the description of the present disclosure, and the same reference numerals are used throughout the different drawings to designate the same or similar components.

Hereinafter, a pixel and a display device including the pixel in accordance with exemplary embodiments of the present disclosure will be described with reference to the accompanying drawings pertaining to the exemplary embodiments of the present disclosure.

FIG. 1 is a diagram illustrating a display device 10 in accordance with an exemplary embodiment of the present disclosure.

The display device 10 in accordance with an exemplary embodiment of the present disclosure may include a display unit 100, a scan driver 200, an auxiliary driver 300, a data driver 400, an emission driver 500, a voltage generator 600, and a timing controller 700.

Figure 2A:
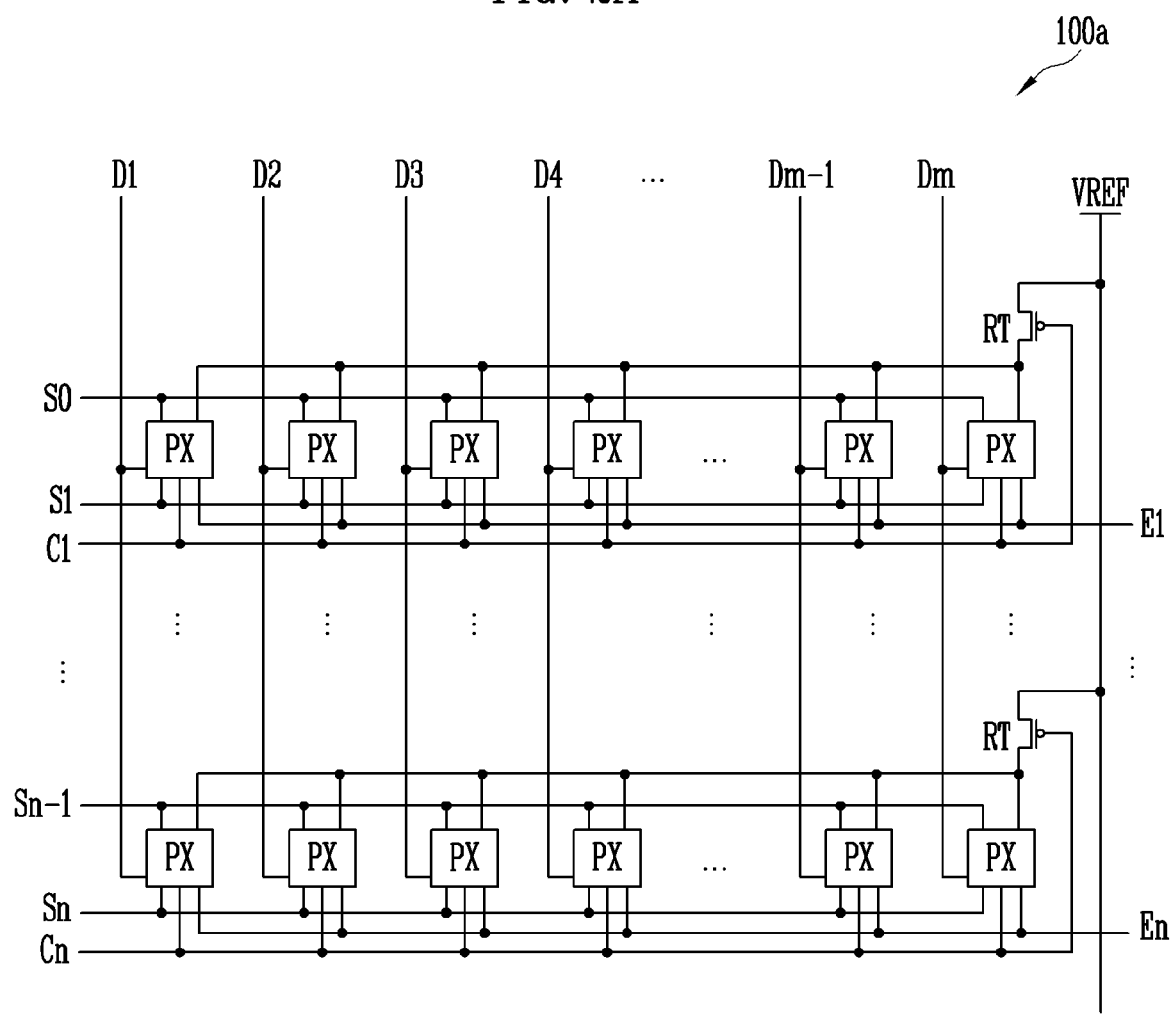
FIG. 2A is a diagram illustrating a display unit in accordance with an exemplary embodiment of the present disclosure.
Figure 2B:
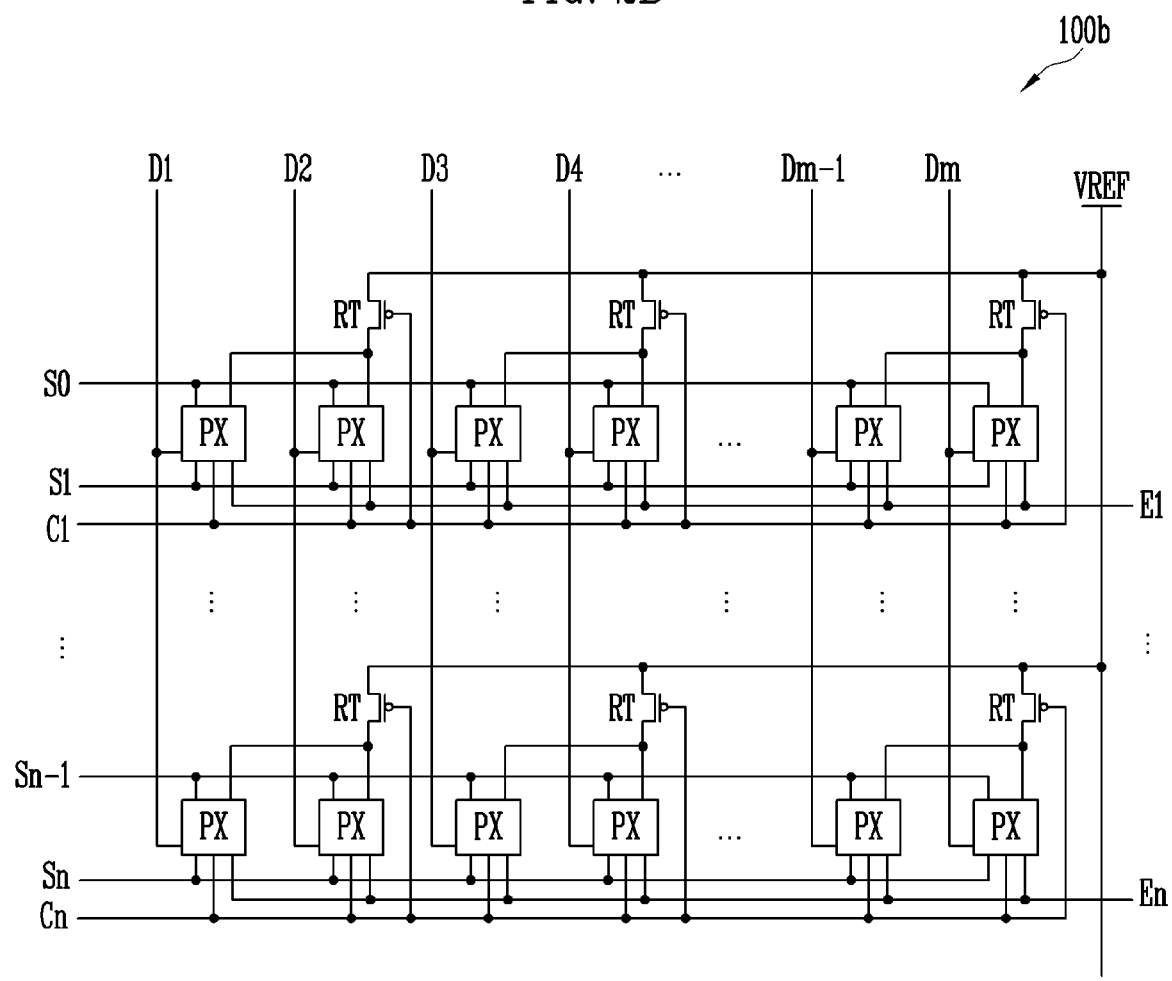
FIG. 2B is a diagram illustrating a display unit in accordance with an exemplary embodiment of the present disclosure.
Figure 2C:
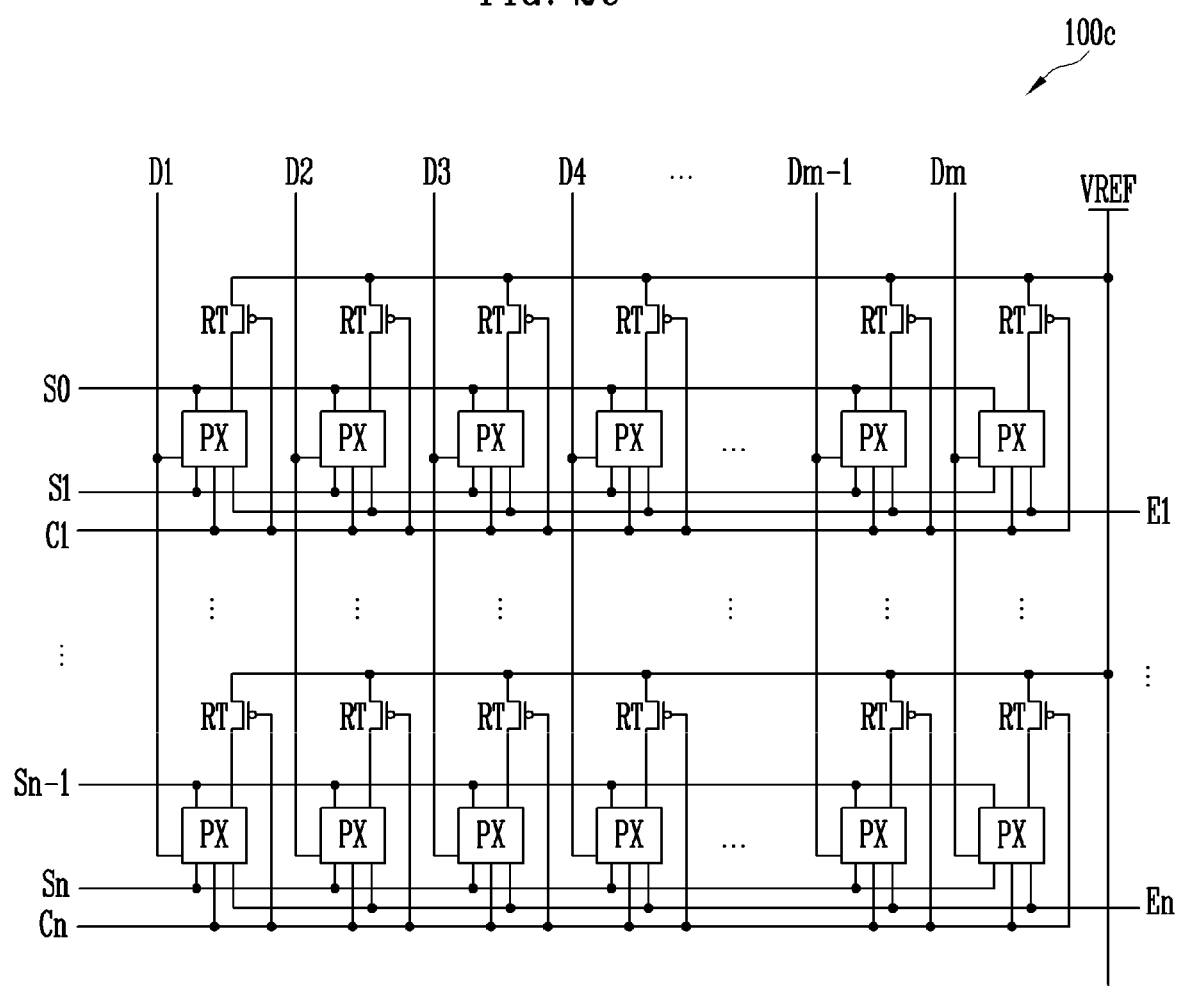
FIG. 2C is a diagram illustrating a display unit in accordance with an exemplary embodiment of the present disclosure.

The display unit 100 may include a plurality of pixels PX, and a plurality of reference transistors RT (refer to FIGS. 2A to 2C).

The display unit 100 may be coupled with a plurality of scan lines S0 to Sn, a plurality of auxiliary lines C1 to Cn, a plurality of emission control lines E1 to En (where n is a natural number), and a plurality of data lines D1 to Dm (where m is a natural number). Furthermore, the display unit 100 may be supplied with first pixel power ELVDD, second pixel power ELVSS, auxiliary power VINT, and reference power VREF from the voltage generator 600.

For example, the voltage of the reference power VREF may be less than or equal to that of the first pixel power ELVDD.

For the sake of explanation, in FIG. 1, the pixels PX are illustrated as four blocks. However, the present disclosure is not limited to the structure of this exemplary embodiment. The pixels PX will be described in detail later with reference to FIGS. 2A to 2C.

The pixels PX may be coupled with the scan lines S0 to Sn, the auxiliary lines C1 to Cn, the emission control lines E1 to En, and the data lines D1 to Dm. Furthermore, the pixels PX may be supplied with the first pixel power ELVDD, the second pixel power ELVSS, the auxiliary power VINT, and the reference power VREF from the voltage generator 600.

The pixels PX may be supplied with scan signals from the scan lines S0 to Sn, and supplied with data signals from the data lines D1 to Dm in synchronization with the scan signals.

Each of the pixels PX that have been supplied with the data signals may control the amount of driving current flowing from the first pixel power source ELVDD to the second pixel power source ELVSS via an organic light-emitting diode (not shown). The organic light-emitting diode may generate light having a luminance corresponding to the amount of driving current.

Furthermore, each pixel PX may be coupled to the corresponding scan lines S0 to Sn. In an exemplary embodiment, each pixel PX may be coupled both with a corresponding one of the scan lines S0 to Sn and with a preceding scan line. For example, the pixels PX that are disposed on an i-th horizontal line may be coupled with an i-th scan line Si and an i−1-th scan line Si−1.

The scan driver 200 may supply a plurality of scan signals to the scan lines S0 to Sn in response to a scan driver control signal SCS supplied from the timing controller 700.

For example, the scan driver 200 may sequentially supply the scan signals to the scan lines S0 to Sn. If the scan signals are sequentially supplied to the scan lines S0 to Sn, the pixels PX may be sequentially selected on a horizontal line basis.

Here, each scan signal may have a voltage level at which a transistor that is supplied with the scan signal can be turned on. In other words, the scan signal may have a gate-on voltage.

The auxiliary driver 300 may supply a plurality of auxiliary signals to the auxiliary lines C1 to Cn in response to an auxiliary driver control signal CCS supplied from the timing controller 700.

For example, the auxiliary driver 300 may sequentially supply the auxiliary signals to the auxiliary lines C1 to Cn.

Here, each auxiliary signal may have a voltage level at which a transistor that is supplied with the auxiliary signal can be turned on. In other words, the auxiliary signal may have a gate-on voltage.

The data driver 400 may supply data signals to the data lines D1 to Dm in response to a data control signal DCS.

The data signals supplied to the data lines D1 to Dm may be supplied to pixels PX selected by the respective scan signals.

To this end, the data driver 400 may supply a plurality of data signals to the data lines D1 to Dm in synchronization with scan signals.

The emission driver 500 may supply a plurality of emission control signals to the emission control lines E1 to En in response to an emission driver control signal ECS supplied from the timing controller 700.

For example, the emission driver 500 may sequentially supply the emission control signals to the emission control lines E1 to En.

Here, each emission control signal may have a voltage level at which a transistor that is supplied with the emission control signal can be turned off. In other words, the emission control signal may have a gate-off voltage.

The voltage generator 600 may generate the first pixel power ELVDD, the second pixel power ELVSS, the auxiliary power VINT, and the reference power VREF and supply them to the display unit 100 in response to a voltage generator control signal VCS supplied from the timing controller 700.

However, the present disclosure is not limited to this operation. In an exemplary embodiment, the first pixel power ELVDD, the second pixel power ELVSS, the auxiliary power VINT, and the reference power VREF may be supplied from an external device.

Here, the auxiliary power VINT may be set to a value lower than the voltage of a data signal. For example, the auxiliary power VINT may be set such that an organic light-emitting diode does not emit light. The voltage of the reference power VREF may be less than or equal to that of the first pixel power ELVDD.

The timing controller 700 may generate the scan driver control signal SCS, the auxiliary driver control signal CCS, the data driver control signal DCS, the emission driver control signal ECS, and the voltage generator control signal VCS in response to control signals supplied from an external device.

The scan driver control signal SCS may be supplied to the scan driver 200. The data driver control signal DCS may be supplied to the data driver 400. The emission driver control signal ECS may be supplied to the emission driver 500. The auxiliary driver control signal CCS may be supplied to the auxiliary driver 300. The voltage generator control signal VCS may be supplied to the voltage generator 600.

The timing controller 700 may translate image data input from the external device into image data DAT corresponding to the specifications of the data driver 400, and then supply the image data DAT to the data driver 400.

The scan driver control signal SCS may include a scan start signal and clock signals. The scan start signal may control a supply timing of scan signals, and the clock signals may be used to shift the scan start signal.

The auxiliary driver control signal CCS may include an auxiliary start signal and clock signals. The auxiliary start signal may control a supply timing of auxiliary signals, and the clock signals may be used to shift the auxiliary start signal.

The data driver control signal DCS may include a source start signal, a source output enable signal, a source sampling clock, etc. The source start signal may control a point in time at which a data sampling operation of the data driver 400 starts. The source sampling to clock may control the sampling operation of the data driver 400 based on a rising or falling edge. The source output enable signal may control an output timing of the data driver 400.

The emission driver control signal ECS may include an emission start signal and clock signals. The emission start signal may control a supply timing of an emission control signal, and the clock signals may be used to shift the emission start signal.

In FIG. 1, there is illustrated an example in which n+1 scan lines S0 to Sn, n emission control lines E1 to En, and n auxiliary lines C1 to Cn are provided, but the present disclosure is not limited thereto. For instance, dummy scan lines, dummy emission control lines, and dummy initialization lines may be additionally formed to secure the reliability of the operation.

In FIG. 1, there is illustrated an example in which the scan driver 200, the auxiliary driver 300, the data driver 400, the emission driver 500, the voltage generator 600, and the timing controller 700 are separately provided, but at least some of the foregoing components may be integrated with each other, as needed. In an exemplary embodiment, the scan driver 200 and the auxiliary driver 300 may be set to an identical driver.

The scan driver 200, the auxiliary driver 300, the data driver 400, the emission driver 500, the voltage generator 600, and the timing controller 700 may be installed using any one of various methods, such as chip-on-glass, chip-on-plastic, tape carrier package, and chip-on-film methods.

FIG. 2A is a diagram illustrating a display unit 100a in accordance with an exemplary embodiment of the present disclosure. In an exemplary embodiment shown in FIG. 2A, the display unit 100a may include a plurality of pixels PX, and a plurality of reference transistors RT.

The pixels PX may be arranged in the form of a matrix.

Furthermore, the pixels PX may be coupled with the scan lines S0 to Sn. For example, the pixels PX that are disposed on an n-th horizontal line may be coupled with the n-th scan line Sn and the n−1-th scan line Sn−1.

The pixels PX may be coupled with the auxiliary lines C1 to Cn. For example, the pixels PX that are disposed on the n-th horizontal line may be coupled with the n-th auxiliary line Cn.

The pixels PX may be coupled with the emission control lines E1 to En. For example, the pixels PX that are disposed on the n-th horizontal line may be coupled with the n-th emission control line En.

The pixels PX may be coupled with the data lines D1 to Dm. For example, the pixels PX that are disposed on an m-th vertical line may be coupled with the m-th data line Dm.

In an exemplary embodiment, a single reference transistor RT may be disposed on each horizontal line. The reference transistor RT may be electrically coupled with all pixels PX that are disposed on the corresponding horizontal line. Details pertaining to this will be described below.

The reference transistors RT may be disposed along a power line to which the reference power VREF is supplied.

The reference transistors RT may be coupled with the reference power source VREF. For example, the reference transistor RT that is disposed on the n-th horizontal line may be coupled with the reference power source VREF. In detail, a first electrode of the reference transistor RT that is disposed on the n-th horizontal line may be coupled with the reference power source VREF.

The reference transistors RT may be coupled with the corresponding pixels PX. For example, the reference transistor RT that is disposed on the n-th horizontal line may be coupled with the pixels PX that are disposed on the n-th horizontal line. In detail, a second electrode of the reference transistor RT that is disposed on the n-th horizontal line may be coupled with the pixels PX that are disposed on the n-th horizontal line.

The reference transistors RT may be coupled with the corresponding auxiliary lines C1 to Cn. For example, the reference transistor RT that is disposed on the n-th horizontal line may be coupled with the n-th auxiliary line Cn. In detail, a gate electrode of the reference transistor RT that is disposed on the n-th horizontal line may be coupled with the n-th auxiliary line Cn.

Therefore, the reference transistors RT may provide the reference power VREF to the pixels PX in response to auxiliary signals supplied to the auxiliary lines C1 to Cn. For example, the reference transistor RT that is disposed on the n-th horizontal line may provide, in response to an auxiliary signal supplied to the n-th auxiliary line Cn, the reference power VREF to the pixels PX that are disposed on the n-th horizontal line.

FIG. 2B is a diagram illustrating a display unit 100b in accordance with an exemplary embodiment of the present disclosure. FIG. 2B is a diagram illustrating a display unit 100c in accordance with an exemplary embodiment of the present disclosure. To avoid redundancy of explanation, descriptions of parts overlapping those of the exemplary embodiment of FIG. 2A will be omitted. Referring to FIGS. 2A, 2B, and 2C, the display unit 100b or 100c may include a plurality of pixels PX, and a plurality of reference transistors RT.

A plurality of reference transistors RT may be disposed on each horizontal line.

In an exemplary embodiment shown in FIG. 2B, the reference transistors RT that are disposed on each horizontal line may be electrically coupled with different pixels PX that are disposed on the corresponding horizontal line. In other words, the reference transistors RT may not be coupled to the same pixel PX.

In an exemplary embodiment shown in FIG. 2C, the reference transistors RT that are disposed on each horizontal line may be electrically coupled in one-to-one correspondence with the respective pixels PX that are disposed on the corresponding horizontal line. Details pertaining to this will be described below.

The reference transistors RT may be arranged in the form of a matrix along a power line to which the reference power VREF is supplied.

The reference transistors RT may be coupled with the reference power source VREF. For example, the reference transistor RT that is disposed on the n-th horizontal line and the m-th vertical line may be coupled with the reference power source VREF. In detail, a first electrode of each of the reference transistors RT that are disposed on the n-th horizontal line may be coupled with the reference power source VREF.

The reference transistors RT may be coupled with the corresponding pixels PX.

For example, in the case of the exemplary embodiment of FIG. 2B, the second electrode of the reference transistor RT that is disposed on the n-th horizontal line and the m-th vertical line may be coupled both with the pixel PX that is disposed on the n-th horizontal line and an m–1-th vertical line and with the pixel PX that is disposed on the n-th horizontal line and the m-th vertical line.

For instance, in the case of the exemplary embodiment of FIG. 2C, the second electrode of the reference transistor RT that is disposed on the n-th horizontal line and the m-th vertical line may be coupled with the pixel PX that is disposed on the n-th horizontal line and the m-th vertical line.

The reference transistors RT may be coupled with the corresponding auxiliary lines C1 to Cn. For example, the reference transistors RT that are disposed on the n-th horizontal line may be coupled with the n-th auxiliary line Cn. In detail, a gate electrode of each of the reference transistors RT that are disposed on the n-th horizontal line may be coupled with the n-th auxiliary line Cn.

Therefore, the reference transistors RT may provide the reference power VREF to the pixels PX in response to auxiliary signals supplied to the auxiliary lines C1 to Cn. For example, the reference transistors RT that are disposed on the n-th horizontal line may provide, in response to an auxiliary signal supplied to the n-th auxiliary line Cn, the reference power VREF to the pixels PX that are disposed on the n-th horizontal line.

The power line to which the reference power VREF is supplied may be parallel with the data lines D1 to Dm.

For the sake of explanation, in FIGS. 2A to 2C, the power line to which the reference power VREF is supplied is illustrated as being disposed outside the pixels PX. However, the present disclosure is not limited to this structure. In an exemplary embodiment, the power line to which the reference power VREF is supplied may be disposed between the pixels PX.

For the sake of explanation, in FIGS. 2A to 2C, the reference power VREF is illustrated as being supplied to the pixels PX through the single power line. However, the present disclosure is not limited to this structure. In an exemplary embodiment, the reference power VREF may be supplied to the pixels PX through a plurality of power lines.

Figure 3:
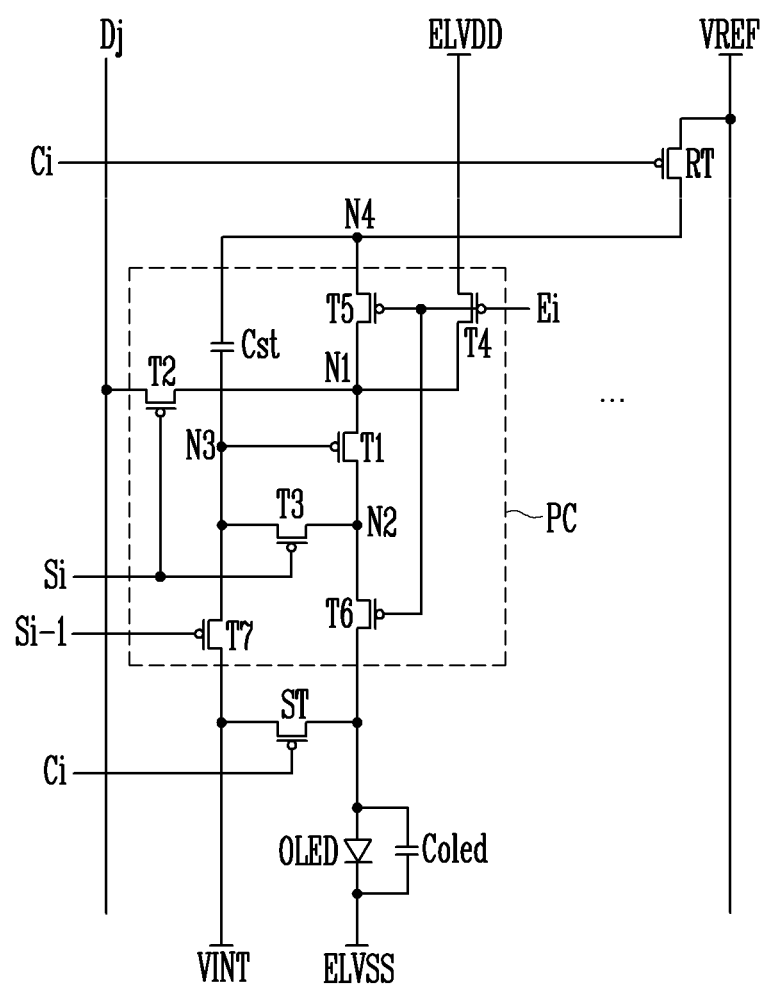
FIG. 3 is a diagram illustrating a pixel in accordance with an exemplary embodiment of the present disclosure.

FIG. 3 is a diagram illustrating a pixel PX in accordance with an exemplary embodiment of the present disclosure.

For the sake of explanation, FIG. 3 illustrates a pixel PX coupled with an i-th (where i is a natural number) emission control line Ei and a j-th (where j is a natural number) data line Dj, and a reference transistor RT coupled to the pixel PX.

Referring to FIG. 3, the pixel PX in accordance with an exemplary embodiment of the present disclosure may include an organic light-emitting diode OLED, a pixel circuit PC configured to control driving current to be supplied to the organic light-emitting diode OLED, and an auxiliary transistor ST.

An anode electrode of the organic light-emitting diode OLED may be coupled to the pixel circuit PC, and a cathode electrode thereof may be coupled to the second pixel power source ELVSS.

The organic light-emitting diode OLED may emit light having a predetermined luminance corresponding to the driving current supplied from the pixel circuit PC.

The first pixel power source ELVDD may be set to a voltage higher than that of the second pixel power source ELVSS so that current can flow to the organic light-emitting diode OLED.

The auxiliary transistor ST may be coupled between the auxiliary power source VINT and the anode electrode of the organic light-emitting diode OLED. A gate electrode of the auxiliary transistor ST may be coupled to an i-th auxiliary line Ci. When an auxiliary signal is supplied to the i-th auxiliary line Ci, the auxiliary transistor ST may be turned on to supply the voltage of the auxiliary power source VINT to the anode electrode of the organic light-emitting diode OLED.

If the voltage of the auxiliary power source VINT is supplied to the anode electrode of the organic light-emitting diode OLED, a parasitic capacitor (hereinafter, referred to as "organic capacitor (Coled)") of the organic light-emitting diode OLED is discharged. When the organic capacitor Coled is discharged, the black expression performance of the organic light-emitting diode OLED may be enhanced.

In detail, the organic capacitor Coled may charge, during a preceding frame period, a predetermined voltage corresponding to driving current supplied from the pixel circuit PC. If the organic capacitor Coled is charged, the organic light-emitting diode OLED may easily emit light even at low current levels.

During a current frame period, a black data signal may be supplied to the pixel circuit PC. If the black data signal is supplied to the pixel circuit PC, the pixel circuit PC must not supply current to the organic light-emitting diode OLED. However, the pixel circuit PC supplied with the black data signal may generate predetermined leakage current. The predetermined leakage current may be supplied to the organic light-emitting diode OLED. In this case, if the organic capacitor Coled is in a charged state, the organic light-emitting diode OLED may slightly emit light. Thus, the black expression performance of the organic light-emitting diode OLED may be reduced.

Unlike this, in an embodiment of the present disclosure, the organic capacitor Coled is discharged by the voltage of the auxiliary power source VINT, so that the organic light-emitting diode OLED may be set to a non-emission state even if leakage current is supplied thereto. In other words, in an exemplary embodiment of the present disclosure, since the auxiliary power VINT is supplied to the anode electrode of the organic light-emitting diode OLED, the black expression performance of the organic light-emitting diode OLED may be enhanced.

For example, the pixel circuit PC may control, in response to a data signal, the amount of driving current flowing from the first pixel power source ELVDD to the second pixel power source ELVSS via the organic light-emitting diode OLED. In addition, the pixel circuit PC may control, in response to an emission control signal, the time for which the driving current flows. Overall, the pixel circuit PC may control the driving current.

To this end, the pixel circuit PC may include a first transistor T1, a second transistor T2, a third transistor T3, at least one emission control transistor (e.g., fourth to sixth transistors T4 to T6), a seventh transistor T7, and a storage capacitor Cst.

A first electrode of the first transistor (driving transistor) T1 may be coupled to a first node N1, a second electrode thereof may be coupled to a second node N2, and a gate electrode thereof may be coupled to a third node N3.

In detail, the first electrode of the first transistor T1 may be coupled to the first pixel power source ELVDD via the fourth transistor T4, and the second electrode thereof may be coupled to the anode electrode of the organic light-emitting diode OLED via the sixth transistor T6.

The first transistor T1 may control, in response to a data signal supplied to the j-th data line Dj, the amount of driving current flowing from the first pixel power source ELVDD to the second pixel power source ELVSS via the organic light-emitting diode OLED.

The second transistor T2 may be coupled between the j-th data line Dj and the first node N1. In other words, the second transistor T2 may be coupled between the first electrode of the first transistor T1 and the j-th data line Dj.

A gate electrode of the second transistor T2 may be coupled to the i-th scan line Si. When a scan signal is supplied to the i-th scan line Si, the second transistor T2 may be turned on to electrically couple the j-th data line Dj with the first node N1.

The third transistor T3 may be coupled between the second node N2 and the third node N3. In other words, the third transistor T3 may be coupled between the gate electrode of the first transistor T1 and the second electrode of the first transistor T1.

A gate electrode of the third transistor T3 may be coupled to the i-th scan line Si. When a scan signal is supplied to the i-th scan signal Si, the third transistor T3 may be turned on so that the first transistor T1 is connected in the form of a diode.

The emission control transistor may be disposed on a path along which driving current flows, and may interrupt the flow of the driving current in response to an emission control signal supplied to an i-th emission control line Ei.

For example, the emission control transistor may include the fourth transistor T4, the fifth transistor T5, and the sixth transistor T6.

The fourth transistor T4 may be coupled between the first pixel power source ELVDD and the first node N1. In other words, the fourth transistor T4 may be coupled between the first pixel power source ELVDD and the first electrode of the first transistor T1.

A gate electrode of the fourth transistor T4 may be coupled to the i-th emission control line Ei. The fourth transistor T4 may be turned off when an emission control signal is supplied to the emission control line Ei, and may be turned on when an emission control signal is not supplied thereto.

The fifth transistor T5 may be coupled between the reference transistor RT and the first node N1. In other words, the fifth transistor T5 may be coupled between the reference transistor RT and the first electrode of the first transistor T1.

A gate electrode of the fifth transistor T5 may be coupled to the i-th emission control line Ei. The fifth transistor T5 may be turned off when an emission control signal is supplied to the emission control line Ei, and may be turned on when an emission control signal is not supplied thereto.

The sixth transistor T6 may be coupled between the second node N2 and the anode electrode of the organic light-emitting diode OLED.

In other words, the sixth transistor T6 may be coupled between the second electrode of the first transistor T1 and the anode electrode of the organic light-emitting diode OLED. A gate electrode of the sixth transistor T6 may be coupled to the i-th emission control line Ei.

The sixth transistor T6 may be turned off when an emission control signal is supplied to the emission control line Ei, and may be turned on when an emission control signal is not supplied thereto.

The seventh transistor T7 may be coupled between the third node N3 and the auxiliary power source VINT. In other words, the seventh transistor T7 may be coupled between the gate electrode of the first transistor T1 and the auxiliary power source VINT.

A gate electrode of the seventh transistor T7 may be coupled to the i−1-th scan line Si−1. When a scan signal is supplied to the i−1-th scan line Si−1, the seventh transistor T7 is turned on so that the voltage of the auxiliary power source VINT can be supplied to the third node N3. The voltage of the auxiliary power source VINT may be set to a voltage lower than that of a data signal.

The storage capacitor Cst may be coupled between the reference transistor RT and the third node N3. In other words, the storage capacitor Cst may be coupled between the reference power source VREF and the gate electrode of the first transistor T1 via the reference transistor RT.

The storage capacitor Cst may store a voltage corresponding both to a data signal and to a threshold voltage of the first transistor T1, based on the reference power VREF.

The reference transistor RT may be coupled between a fourth node N4 and the reference power source VREF. In other words, the reference transistor RT may be coupled between the storage capacitor Cst and the reference power source VREF.

A gate electrode of the reference transistor RT may be coupled to the i-th auxiliary line Ci. The reference transistor RT may be turned on when an auxiliary signal is supplied to the i-th auxiliary line Ci, and may be turned off when an auxiliary signal is not supplied thereto.

In the present disclosure, the organic light-emitting diode OLED may generate light having various colors including red, green, and blue in response to current supplied from the driving transistor, but the present disclosure is not limited thereto. For instance, the organic light-emitting diode OLED may generate white light depending on the amount of current supplied from the driving transistor. In this case, a separate color filter or the like may be used to embody a color image.

Figure 4:
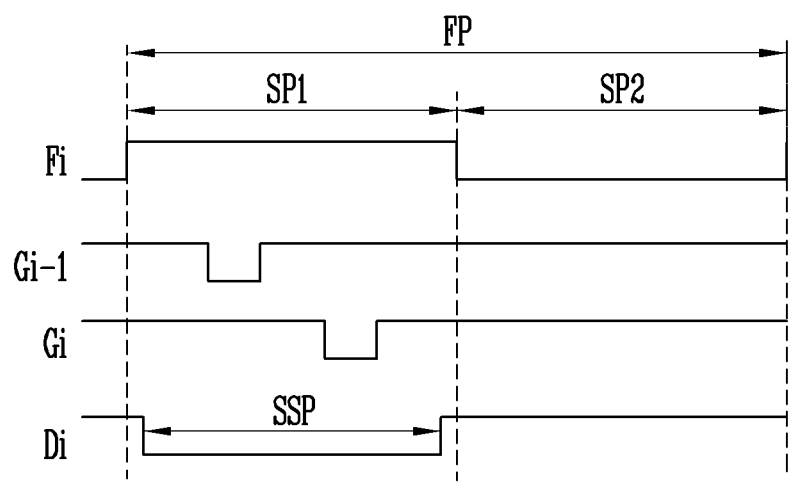
FIG. 4 is a waveform diagram illustrating the operation of a pixel in accordance with an exemplary embodiment of the present disclosure.

FIG. 4 is a waveform diagram illustrating the operation of a pixel in accordance with an exemplary embodiment of the present disclosure.

Particularly, FIG. 4 illustrates a scan signal Gi−1 supplied to the i−1-th scan line Si−1 during one frame period FP, a scan signal Gi supplied to the i-th scan line Si, an auxiliary signal Di supplied to the i-th auxiliary line Ci, and an emission control signal Fi supplied to the i-th emission control line Ei.

Referring to FIG. 4, the one frame period FP may include a first sub-period SP1 and a second sub-period SP2.

In the first sub-period SP1, the emission control signal Fi for controlling a non-emission period of the pixel PX may be supplied. The emission time and the emission intensity of the pixel PX may be controlled by adjusting an entire supply period (a duty ratio) of emission control signals Fi.

In other words, when a width (W) of each emission control signal Fi is reduced, the luminance of the pixel PX may be increased. When the width (W) of each emission control signal Fi is increased, the luminance of the pixel PX may be reduced.

Referring to FIGS. 3 and 4, during the first sub-period SP1, an emission control signal Fi may be supplied to the i-th emission control line Ei. When the emission control signal Fi is supplied to the i-th emission control line Ei, the fourth transistor T4, the fifth transistor T5, and the sixth transistor T6 may be turned off.

When the fourth transistor T4 is turned off, the first pixel power source ELVDD and the first electrode of the first transistor T1 may be electrically blocked from each other.

When the fifth transistor T5 is turned off, the reference transistor RT may be electrically blocked from the first electrode of the first transistor T1.

When the sixth transistor T6 is turned off, the anode electrode of the organic light-emitting diode OLED may be electrically blocked from the second node N2. In other words, when the sixth transistor T6 is turned off, the anode electrode of the organic light-emitting diode OLED may be electrically blocked from the second electrode of the first transistor T1.

Therefore, during a period in which the emission control signal Fi is supplied to the i-th emission control line Ei, the pixel PX may be set to a non-emission state.

After the emission control signal Fi has been supplied to the i-th emission control line Ei, an auxiliary signal Di may be supplied to the i-th auxiliary line Ci. When the auxiliary signal Di is supplied to the i-th auxiliary line Ci, the auxiliary transistor ST and the reference transistor RT may be turned on.

If the auxiliary transistor ST is turned on, the voltage of the auxiliary power source VINT may be supplied to the anode electrode of the organic light-emitting diode OLED. Hence, the organic capacitor Coled of the organic light-emitting diode OLED may be discharged.

If the reference transistor RT is turned on, the voltage of the reference power source VREF may be supplied to an end of the storage capacitor Cst. Hence, the storage capacitor Cst may reliably store the voltage of a data signal, based on the reference power VREF.

The auxiliary signal Di may be supplied to the i-th auxiliary line Ci during an auxiliary period SSP. The first sub-period SP1 may include the auxiliary period SSP. In other words, the first sub-period SP1 may overlap the entirety of the auxiliary period SSP.

After the auxiliary signal Di has been supplied to the i-th auxiliary line Ci, a scan signal Gi−1 may be supplied to the i−1-th scan line Si−1. When the scan signal Gi−1 is supplied to the i−1-th scan line Si−1, the fourth transistor T4 may be turned on. If the fourth transistor T4 is turned on, the voltage of the auxiliary power source VINT may be supplied to the third node N3.

After the scan signal Gi−1 has been supplied to the i−1-th scan line Si−1, a scan signal Gi may be supplied to the i-th scan line Si. When the scan signal Gi is supplied to the i-th scan line Si, the second transistor T2 and the third transistor T3 may be turned on.

When the third transistor T3 is turned on, the second electrode of the first transistor T1 and the third node N3 may be electrically coupled to each other. In other words, when the third transistor T3 is turned on, the first transistor T1 may be connected in the form of a diode.

When the second transistor T2 is turned on, a data signal may be supplied from the data line Dj to the first electrode of the first transistor T1. Here, since the third node N3 is set to the voltage of the auxiliary power source VINT that is lower than the data signal, the first transistor T1 may be turned on.

If the first transistor T1 is turned on, a voltage formed by subtracting the absolute value of the threshold voltage of the first transistor T1 from the voltage of the data signal may be supplied to the third node N3. Here, the storage capacitor Cst stores a voltage corresponding to the third node N3.

Subsequently, during the second sub-period SP2, the supply of the emission control signal Fi to the i-th emission control line Ei may be interrupted. When the supply of the emission control signal Fi to the i-th emission control line Ei is interrupted, the fourth transistor T4, the fifth transistor T5, and the sixth transistor T6 may be turned on.

When the fourth transistor T4 is turned on, the first pixel power source ELVDD and the first electrode of the first transistor T1 may be electrically coupled with each other. Therefore, the first transistor T1 may control, in correspondence with the voltage of the third node N3, the amount of current flowing from the first pixel power source ELVDD to the second pixel power source ELVSS via the organic light-emitting diode OLED. Therefore, the organic light-emitting diode OLED may generate light having a predetermined luminance corresponding to the amount of current supplied from the first transistor T1.

When the fifth transistor T5 is turned on, the first electrode of the first transistor T1 and the storage capacitor Cst may be electrically coupled to each other. Hence, if the fifth transistor T5 is turned on, the first pixel power ELVDD may be provided to the storage capacitor Cst.

Here, the supply of the auxiliary signal Di to the i-th auxiliary line Ci is interrupted, so that the reference transistor RT is in a turned-off state. Therefore, the reference power source VREF and the first pixel power source ELVDD are not shorted.

When the sixth transistor T6 is turned on, the second electrode of the first transistor T1 and the anode electrode of the organic light-emitting diode OLED may be electrically coupled with each other.

Although, in FIG. 4, there is illustrated an example in which the auxiliary signal Di is supplied to the i-th auxiliary line Ci before the scan line Gi−1 is supplied to the i−1 scan line Si−1, the present disclosure is not limited thereto. In various exemplary embodiments, the auxiliary signal Di may be supplied to the i-th auxiliary line Ci at various points in time such that the auxiliary signal Di overlaps the emission control signal Fi to be supplied to the i-th emission control line Ei.

Furthermore, in FIG. 4, there is illustrated an example in which one scan signal Gi−1 is supplied to the i−1-th scan line Si−1 and one scan signal Gi is supplied to the i-th scan line Si, but the present disclosure is not limited thereto. In an exemplary embodiment, successive scan signals may be supplied to the i−1-th scan line Si−1, and successive scan signals may be supplied to the i-th scan line Si.

Figure 5A:
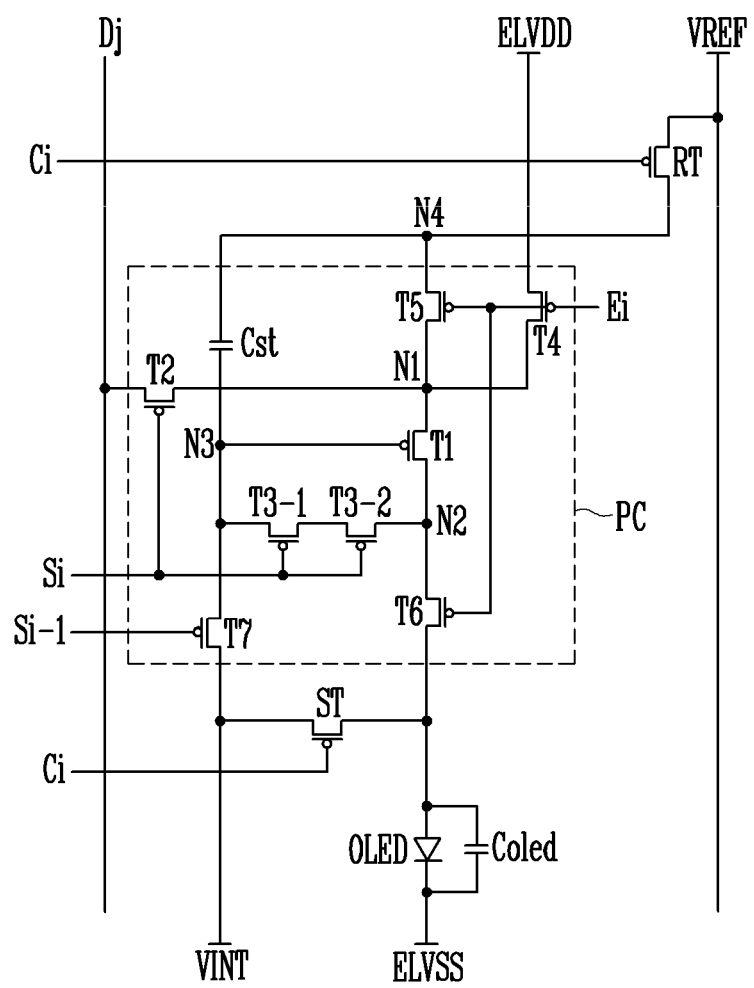
FIG. 5A is a diagram illustrating a pixel in accordance with an exemplary embodiment of the present disclosure.
Figure 5B:
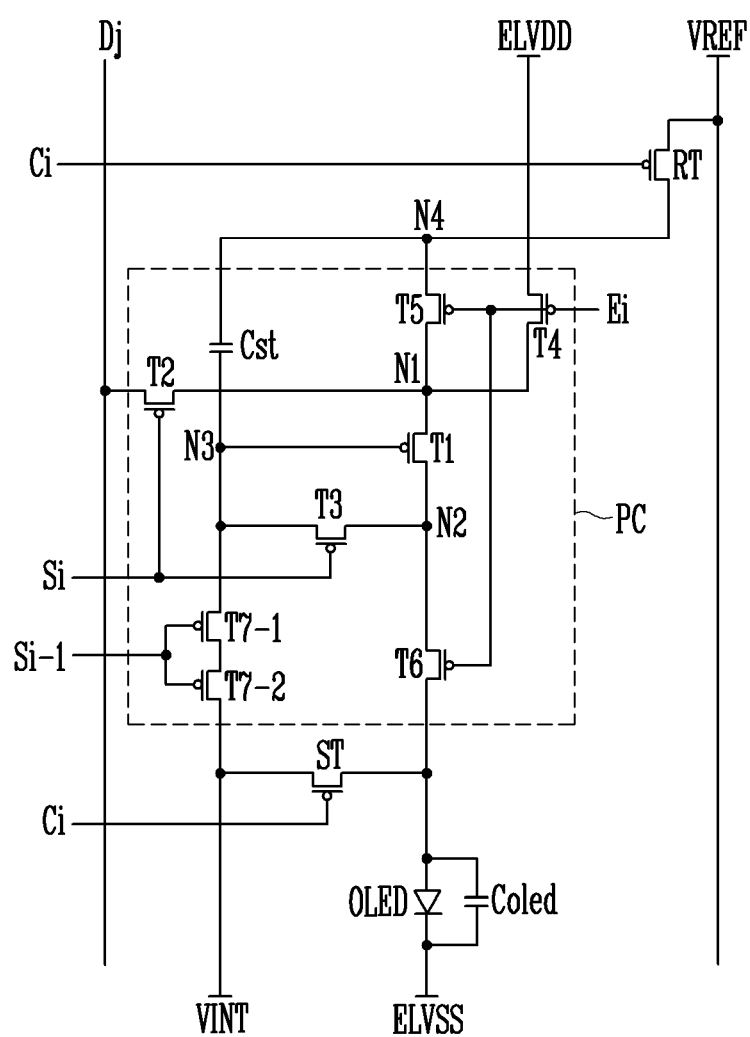
FIG. 5B is a diagram illustrating a pixel in accordance with an exemplary embodiment of the present disclosure.
Figure 5C:
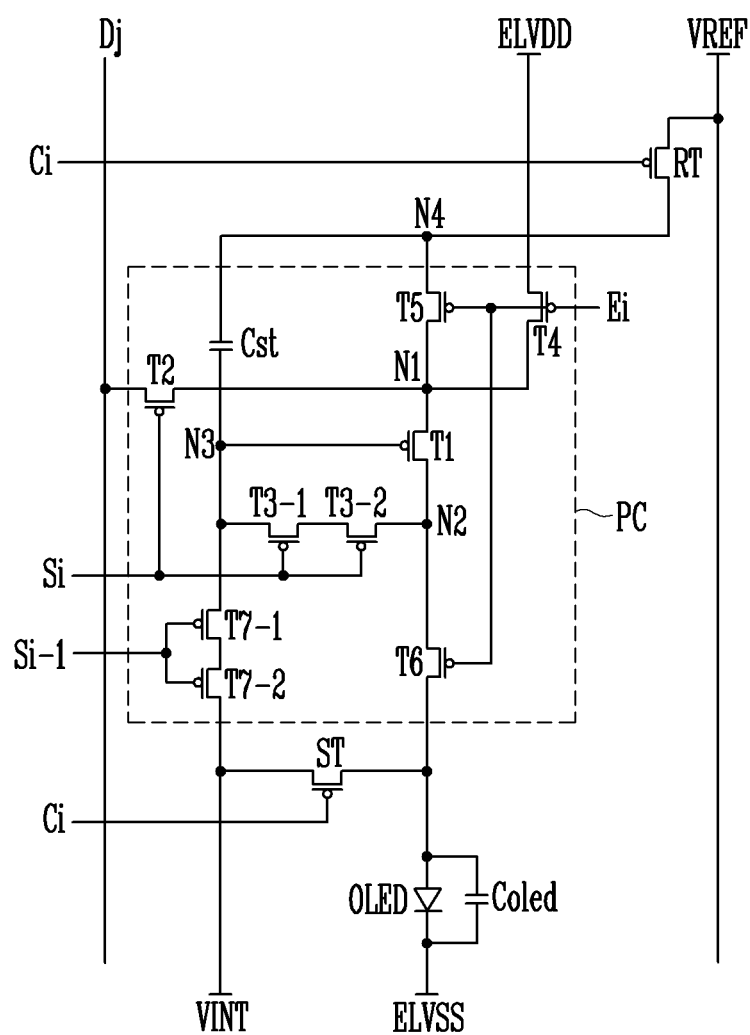
FIG. 5C is a diagram illustrating a pixel in accordance with an exemplary embodiment of the present disclosure.

FIG. 5A is a diagram illustrating a pixel in accordance with an exemplary embodiment of the present disclosure. FIG. 5B is a diagram illustrating a pixel in accordance with an exemplary embodiment of the present disclosure. FIG. 5C is a diagram illustrating a pixel in accordance with an exemplary embodiment of the present disclosure. To avoid redundancy of explanation, descriptions of parts overlapping those of the exemplary embodiment of FIG. 2A will be omitted.

Referring to FIGS. 3 and 5A to 5C, the third transistor T3 may include a 3−1-th transistor T3−1 and a 3−2-th transistor T3−2 which are coupled in series between the third node N3 and the second node N2. Each of gate electrodes of the 3−1-th transistor T3−1 and the 3−2-th transistor T3−2 may be supplied with a scan signal from the i-th scan line Si.

The seventh transistor T7 may include a 7−1-th transistor T7−1 and a 7−2-th transistor T7−2 which are coupled in series between the third node N3 and the auxiliary power source VINT. Each of gate electrodes of the 7−1-th transistor T7−1 and the 7−2-th transistor T7−2 may be supplied with a scan signal from the i−1-th scan line Si−1.

Various exemplary embodiments of the present disclosure may provide an organic light-emitting display device which is able to compensate a voltage drop of a driving power source and to mitigate luminance unevenness, thus providing improved image quality.

Various exemplary embodiments of the present disclosure may provide an organic light-emitting display device capable of initializing an anode electrode of an organic light-emitting diode, thus providing improved image quality.

Various exemplary embodiments of the present disclosure may provide an organic light-emitting display device in which a layout space in each pixel can be efficiently used.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. An organic light-emitting display device comprising:
pixels disposed on each of a plurality of horizontal lines, each of the pixels comprising an organic light-emitting diode, and an auxiliary transistor coupled between the organic light-emitting diode and an auxiliary power source; and
at least one reference transistor disposed on each of the horizontal lines and coupled between a reference power source and at least one of the pixels,
wherein:
the auxiliary transistor is directly connected to an anode electrode of the organic light-emitting diode;
the auxiliary transistor and the reference transistor are configured to be simultaneously turned on;
a cathode electrode of the organic light-emitting diode is connected to a second pixel power source; and
each of the pixels comprises:
a first transistor coupled between a first node and a second node, the first transistor comprising a gate electrode coupled to a third node;
a second transistor coupled between a data line and the first node, the second transistor comprising a gate electrode coupled to an i-th scan line;
a third transistor between the third node and the second node, the third transistor comprising a gate electrode coupled to the i-th scan line;
a fourth transistor coupled between a first pixel power source and the first node, the fourth transistor comprising a gate electrode coupled to an i-th emission control line;

a fifth transistor coupled between the reference transistor and the third node, the fifth transistor comprising a gate electrode coupled to the i-th emission control line; and a sixth transistor coupled between the second node and the anode electrode of the organic light-emitting diode, the sixth transistor comprising a gate electrode coupled to the i-th emission control line.

2. The organic light-emitting display device according to claim 1,
wherein one reference transistor is disposed on each of the plurality of horizontal lines, and
wherein the at least one reference transistor is electrically coupled to all pixels disposed on a corresponding horizontal line.

3. The organic light-emitting display device according to claim 1,
wherein a plurality of reference transistors are disposed on each of the plurality of horizontal lines, and
wherein each of the plurality of reference transistors are electrically coupled to different pixels disposed on a corresponding horizontal line.

4. The organic light-emitting display device according to claim 1,
wherein a plurality of reference transistors are disposed on each of the plurality of horizontal lines, and
wherein the plurality of reference transistors are electrically coupled in one-to-one correspondence with the respective pixels disposed on a corresponding horizontal line.

5. The organic light-emitting display device according to claim 1, wherein the auxiliary power source is set such that the organic light-emitting diode does not emit light.

6. An organic light-emitting display device comprising:
pixels disposed on an i-th horizontal line, wherein i is a natural number, each of the pixels comprising an organic light-emitting diode, and an auxiliary transistor coupled between the organic light-emitting diode and an auxiliary power source, the pixel being configured to control, in response to a data signal, a driving current flowing from a first pixel power source to a second pixel power source via the organic light-emitting diode; and
a reference transistor disposed on the i-th horizontal line, and electrically coupled with a reference power source,
wherein:
the reference transistor is configured to be turned on or off simultaneously with the auxiliary transistor;
the auxiliary transistor is directly connected to an anode electrode of the organic light-emitting diode;
the pixels are electrically coupled with the reference power source during a period in which a voltage of the data signal is stored, and are electrically coupled with the first pixel power source during a period other than the period in which the voltage of the data signal is stored; and
each of the pixels disposed on the i-th horizontal line further comprises:
a first transistor coupled between a first node and a second node, the first transistor comprising a gate electrode coupled to a third node;
a second transistor coupled between a data line and the first node, the second transistor comprising a gate electrode coupled to an i-th scan line;
a third transistor between the third node and the second node, the third transistor comprising a gate electrode coupled to the i-th scan line;

a fourth transistor coupled between the first pixel power source and the first node, the fourth transistor comprising a gate electrode coupled to an i-th emission control line;
a fifth transistor coupled between the reference transistor and the third node, the fifth transistor comprising a gate electrode coupled to the i-th emission control line; and
a sixth transistor coupled between the second node and the anode electrode of the organic light-emitting diode, the sixth transistor comprising a gate electrode coupled to the i-th emission control line.

7. The organic light-emitting display device according to claim 6, wherein each of the pixels disposed on the i-th horizontal line further comprises:
a seventh transistor coupled between the third node and the auxiliary power source, the seventh transistor comprising a gate electrode coupled to an i−1-th scan line.

8. The organic light-emitting display device according to claim 6, wherein a gate electrode of the reference transistor and a gate electrode of the auxiliary transistor are electrically coupled to an i-th auxiliary line.

9. The organic light-emitting display device according to claim 8, wherein an auxiliary signal to be supplied to the i-th auxiliary line overlaps an emission control signal to be supplied to the i-th emission control line.

10. The organic light-emitting display device according to claim 6, wherein a voltage of the reference power source is less than or equal to a voltage of the first pixel power source.

11. An organic light-emitting display device comprising:
a display unit comprising a plurality of pixels and a plurality of reference transistors;
a scan driver configured to supply scan signals to a plurality of scan lines coupled to the pixels;
an auxiliary driver configured to supply auxiliary signals to a plurality of auxiliary lines coupled to the pixels;
a data driver configured to supply data signals to a plurality of data lines coupled to the pixels; and
an emission driver configured to supply emission control signals to a plurality of emission control lines coupled to the pixels,
wherein:
at least one reference transistor coupled to an i-th auxiliary line among the reference transistors is coupled between pixels coupled to the i-th auxiliary line among the pixels and a reference power source, wherein i is a natural number, and the at least one reference transistor comprises a gate electrode coupled to the auxiliary line;
one of the pixels that is coupled to an i-th scan line, the i-th auxiliary line, an i-th emission control line, and a j-th data line, where j is a natural number, comprises:
an organic light-emitting diode;
a pixel circuit configured to control a driving current flowing from a first pixel power source to a second pixel power source via the organic light-emitting diode; and
an auxiliary transistor coupled between an auxiliary power source and the organic light-emitting diode, the auxiliary transistor being directly connected to an anode electrode of the organic light-emitting diode, and the auxiliary transistor comprising a gate electrode coupled to the i-th auxiliary line; and
the pixel circuit comprises:
a first transistor coupled between a first node and a second node, the first transistor comprising a gate electrode coupled to a third node;

a second transistor coupled between the i-th data line and the first node, the second transistor comprising a gate electrode coupled to the i-th scan line;

a third transistor between the third node and the second node, the third transistor comprising a gate electrode coupled to the i-th scan line;

a fourth transistor coupled between the first pixel power source and the first node, the fourth transistor comprising a gate electrode coupled to the i-th emission control line;

a fifth transistor coupled between the at least one reference transistor and the third node, the fifth transistor comprising a gate electrode coupled to the i-th emission control line; and a sixth transistor coupled between the second node and the anode electrode of the organic light-emitting diode, the sixth transistor comprising a gate electrode coupled to the i-th emission control line.

12. The organic light-emitting display device according to claim 11, wherein the pixel receives, from the i-th emission control line, an emission control signal having a gate-off voltage during a first sub-period, wherein the pixel receives, from the i-th emission control line, a gate-on voltage during a second sub-period, and wherein the second sub-period is in succession to the first sub-period.

13. The organic light-emitting display device according to claim 12, wherein the pixel receives, from the i-th auxiliary line, an auxiliary signal having a gate-on voltage during an auxiliary period, and wherein the first sub-period is set to overlap an entirety of the auxiliary period.

14. The organic light-emitting display device according to claim 13, wherein the pixel circuit stores a voltage of a data signal supplied to the j-th data line based on the reference power source when a scan signal is supplied to the i-th scan line during the first sub-period, and wherein the pixel circuit interrupts a flow of the driving current during the first sub-period, and allows the flow of the driving current during the second sub-period.

15. The organic light-emitting display device according to claim 11, wherein the scan driver and the auxiliary driver are integrated into a single driver.

16. The organic light-emitting display device according to claim 11, wherein a voltage of the reference power source is less than or equal to a voltage of the first pixel power source.

17. The organic light-emitting display device according to claim 11, further comprising:

a voltage generator configured to supply the first pixel power source, the second pixel power source, the auxiliary power source, and the reference power source to the display unit, wherein the auxiliary power source has a level set such that the organic light-emitting diode does not emit light.

* * * * *